(12) United States Patent
Larson

(10) Patent No.: US 6,982,191 B2
(45) Date of Patent: Jan. 3, 2006

(54) METHODS RELATING TO FORMING INTERCONNECTS AND RESULTING ASSEMBLIES

(75) Inventor: Charles E. Larson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 10/667,003

(22) Filed: Sep. 19, 2003

(65) Prior Publication Data

US 2005/0064696 A1 Mar. 24, 2005

(51) Int. Cl.
*H01L 21/44* (2006.01)
*H01L 21/48* (2006.01)
*H01L 21/50* (2006.01)

(52) U.S. Cl. ............... 438/118; 438/119; 438/456; 438/610; 438/611

(58) Field of Classification Search .......... 438/456, 438/118, 119, 610, 661, FOR 438; 257/E21.514, 257/E23.018
See application file for complete search history.

(56) References Cited

U.S. PATENT DOCUMENTS

| | | | |
|---|---|---|---|
| 5,739,585 A | 4/1998 | Akram et al. | 257/698 |
| 6,163,463 A | 12/2000 | Marrs | 361/773 |
| 6,276,596 B1 | 8/2001 | Gruber et al. | 228/225 |
| 6,341,418 B1 | 1/2002 | Brouillette et al. | 29/890 |
| 6,386,422 B1 | 5/2002 | Cheng et al. | 228/46 |
| 6,426,241 B1 | 7/2002 | Cordes et al. | 438/108 |
| 6,452,117 B2 | 9/2002 | Curcio et al. | 714/262 |
| 6,459,150 B1 * | 10/2002 | Wu et al. | 257/724 |
| 6,461,136 B1 | 10/2002 | Gruber et al. | 425/110 |

FOREIGN PATENT DOCUMENTS

WO    WO 95/05675    * 2/1995

* cited by examiner

*Primary Examiner*—George Fourson
*Assistant Examiner*—Julio J. Maldonado
(74) *Attorney, Agent, or Firm*—TraskBritt

(57) ABSTRACT

Methods relating to forming interconnects through injection of conductive materials, to fabricating semiconductor component assemblies, and to resulting assemblies. A semiconductor component substrate, such as a semiconductor die or other substrate, has dielectric material disposed on a surface thereof, surrounding but not covering interconnect elements, such as bond pads, on that surface. A second semiconductor component substrate, such as a carrier substrate with interconnect elements such as terminal pads, is adhered to the first semiconductor component substrate, forming a semiconductor package assembly having interconnect voids between the corresponding interconnect elements. A flowable conductive material is then injected into each interconnect void using an injection needle that passes through one of the substrates into the interconnect void, forming a conductive interconnect between the bond pads and terminal pads of the substrates. In another embodiment, a conductive material is preplaced into the interconnect voids and ultrasonically heated to a flowable state.

38 Claims, 4 Drawing Sheets

METHODS RELATING TO FORMING INTERCONNECTS AND RESULTING ASSEMBLIES

BACKGROUND OF THE INVENTION

1. Field of the Invention

The present invention relates to semiconductors and semiconductor packages. More particularly, but not limited thereto, it relates to the formation of interconnections between semiconductor substrates, such as semiconductor dice and adjacent substrates in a semiconductor assembly.

2. State of the Art

In conventional flip-chip attachment, an array of conductive bumps such as solder balls is formed on the surface of a semiconductor die, the conductive bumps being used to mechanically and electrically connect the die to higher-level packaging, such as a carrier substrate in the form of a printed circuit board. The formation of the solder balls may be carried out by a number of different methods. For example, a composite solder material of tin and lead may be electrodeposited through a mask to produce a desired pattern of solder masses to form bumps, the solder material then being heated to reflow to form solder balls by surface tension. Another technique is solder paste screening to cover the entire area of a wafer, the paste again being heated to reflow and form the solder balls.

U.S. Pat. No. 6,459,150 to Wu et al., issued Oct. 1, 2002, discloses an alternative technique for forming solder ball connections. A substrate, such as a die or interposer, includes a number of bond pads. Apertures are formed through the body of the substrate and each of the bond pads. A second substrate with corresponding bond pads is placed adjoining the first substrate and solder is deposited through the apertures. Solder reflow is then conducted to form solder balls that mechanically and electrically interconnect the substrates, while forming a conductive plug that passes through the body of the first substrate.

Each of these techniques thus requires solder reflow, typically conducted by passing the semiconductor structure through a reflow oven and subjecting the entire structure to the heat required to induce reflow. Such solder reflow usually involves four well-defined phases: preheat, soak, reflow (spike) and cool. First, in the preheat phase, the solder is warmed to a temperature that is just below its melting point. For example, for one conventional tin/lead solder composition, the structure may be heated to about 30° C. below a melting point of 183° C. In the soak phase, flux used to adhere the solder to under-bump metallization (UBM) formed on bond pads or redistributed bond pads is activated to remove any oxide on the metallization and the temperatures of the substrate and the solder are allowed to become more uniform and stabilized. During this soak period, the temperatures of the solder and the substrate are nearly constant or may increase slightly, for example, by about 20° C. In the reflow or spike period, the temperature is caused to increase rapidly and exceeds the melting point by between 20° C. and 50° C., such that the solder will melt, wet the metallized bond pads and assume a substantially spherical shape from the surface tension of the molten solder. Finally, in the cooling phase the solder balls and the substrate are allowed to cool to a temperature well below the melting point of the solder such that the solder balls solidify. In many instances, reflow to form the solder balls is followed by a subsequent reflow to connect the semiconductor die to a carrier substrate. Conventional techniques for flip-chip connection of a semiconductor die to a carrier substrate using solder are thus somewhat time consuming and subject the entire semiconductor die to elevated temperatures at least once for a substantial period of time, potentially subjecting it to damage as well as shortening the life thereof.

Techniques for flip-chip connection of semiconductor dice to carrier substrates using conductive materials other than solder are also known. For example, conductive or conductor-filled epoxies may be formed into discrete conductive elements in the form of columns or pillars and used to effect such mechanical and electrical connection. However, such an approach also involves preplacement of "dots" of the epoxy material on a semiconductor die or carrier substrate, assembly of the two electrical components desired to be attached, and then effecting cure of the epoxy. Furthermore, in many instances, it is desirable or even required to precure the epoxy to a tacky state, a so-called "B stage," for ease of handling and preliminary adherence of the epoxy to a target surface prior to the final cure.

Accordingly, a method to enable flip-chip style attachment of a semiconductor die to a carrier substrate without the need for the time-consuming process of placing a solder paste or other solder ball precursor on a substrate followed by heating of the substrate or an assembly of substrates to form solder balls would constitute an improvement in the art, as would semiconductor packages constructed using such techniques. Additionally, such a method that would eliminate any need to preplace discrete conductive elements prior to assembly of a semiconductor die with another electronic component such as a carrier substrate would also be desirable.

BRIEF SUMMARY OF THE INVENTION

The present invention, in several embodiments, is directed to methods relating to forming conductive interconnects and associated methods for fabricating semiconductor component assemblies. A semiconductor component substrate, such as a semiconductor substrate, an interposer or other carrier substrate, is provided with an array of first interconnect elements, such as bond pads or terminal pads, on a surface thereof. An electrically insulative, or dielectric, material element is disposed on at least a portion of the surface to surround, but not cover, the first interconnect elements of the array, defining a cavity over each interconnect element. A second semiconductor component substrate, which again may comprise a semiconductor substrate, an interposer or other carrier substrate, is provided with an array of second interconnect elements, such as bond pads or terminal pads, located on a surface thereof in a pattern complementary to the array of first interconnect elements. The first semiconductor component substrate is secured to the second semiconductor component substrate with the first interconnect elements and the second interconnect elements mutually aligned and with the dielectric material providing a standoff therebetween to form a semiconductor component assembly having interconnect voids formed therein between the first interconnect elements and second interconnect elements.

In one embodiment, a flowable conductive material is then injected into each interconnect void using an injection needle that is passed through one of the semiconductor substrate components into that interconnect void to form a conductive interconnect between the aligned first and second interconnect elements associated therewith. One of the semiconductor component substrates may be formed with access holes therethrough associated with interconnect element locations to receive the injection needle, or the injection needle may be used to perforate the substrate through which the conductive material is to be injected. A vent hole may also be optionally formed through a semiconductor component substrate to provide an exit for gases from the interconnect void during injection of the conductive material.

In another embodiment, a mass of conductive material such as a solder pellet or paste mass may be placed in the cavities in the dielectric material layer prior to placement of the second semiconductor component substrate thereover to form the semiconductor component assembly. Thereafter, an ultrasonic head in contact with the exterior of one of the semiconductor component substrates may be used to rapidly heat and melt the solder in the interconnect voids to form solder balls.

Embodiments of semiconductor component assemblies resulting from use of the methods of the present invention are also encompassed by the present invention.

BRIEF DESCRIPTION OF THE DRAWINGS

In the drawings, which depict the best mode presently known for carrying out the present invention.

DETAILED DESCRIPTION OF THE INVENTION

Figure 1:
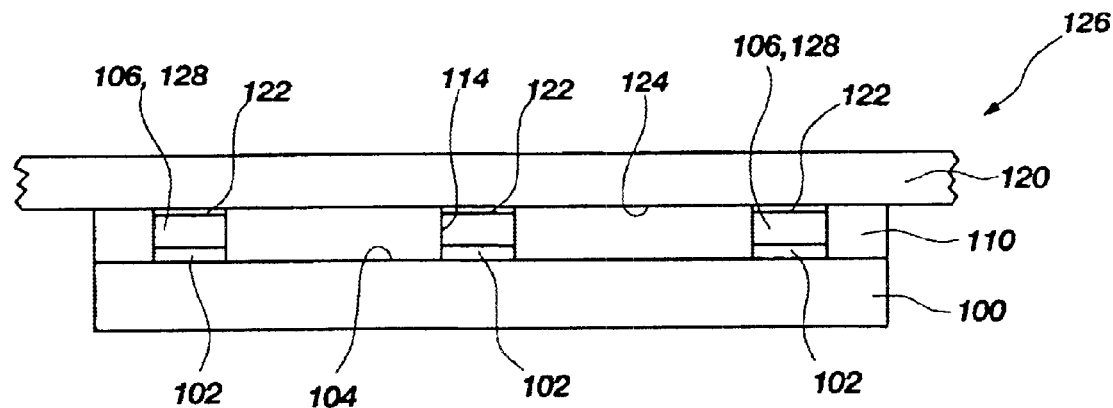
FIG. 1 is a side sectional view of one exemplary embodiment of a semiconductor die attached to a carrier substrate during fabrication of a semiconductor component assembly in accordance with the present invention.

As depicted in FIG. 1, a first semiconductor component substrate in the form of semiconductor die 100 includes a plurality of interconnect elements in the form of bond pads 102 located on an active surface 104 thereof. Of course, the present invention may also be practiced on wafer-scale semiconductor substrates as partial wafer, multi-die substrates. Accordingly, semiconductor die 100 may be taken as a representation of any size or type of semiconductor substrate. Bond pads 102 may comprise bond pads directly connected to integrated circuitry formed on active surface 104, or redistributed bond pads placed in a desired pattern or array and connected by conductive traces extending over the active surface 104 from original bond pad locations, as known to those of ordinary skill in the art. Currently, bond pads have about 4 mils$^2$ surface area, although the present invention is not associated with any specific bond pad area, size or shape.

An electrically insulative, or dielectric, material 10 may be disposed on active surface 104 to enable physical attachment of semiconductor die 100 by its active surface 104 to a second semiconductor substrate component in the form of another substrate. The dielectric material 110 may be disposed over the entire active surface 104, except for a small area surrounding each of the bond pads 102, defining a cavity 106 over each bond pad 102. The dielectric material 110 may comprise a layer of material applied in a flowable state, such as a thermoset resin in, for example, the form of an epoxy, or it may be screen printed or stenciled to define cavities 106 as it is applied and optionally cured to a tacky state, or so-called "B-stage." As with other semiconductor die fabrication processes, it is contemplated that such application would be effected to a semiconductor wafer, prior to singulation of semiconductor dice therefrom. Another approach is to spin coat a wafer with, for example, a polymer such as a polyimide, and then etch through the coating to expose bond pads 102. Further, dielectric material 110 may be applied to active surface 104 as a preformed film of, for example, polyimide (e.g., KAPTON® film), having apertures preformed therein and coated on both sides with a suitable adhesive. As yet another approach, a film of thermoplastic resin may be employed.

A second semiconductor component substrate 120, also termed a "carrier substrate" herein solely for purposes of convenience and not limitation, is aligned with first semiconductor die 100 placed on the dielectric material 110 and adhered to the semiconductor die 100 with dielectric material 110 disposed therebetween. Second semiconductor component substrate 120 may comprise an interposer or other carrier substrate such as a printed circuit board formed, for example, as an FR-4 or a BT resin board, a flexible tape such as a flexible adhesive-coated film, or any other structure having a substantially planar region to which semiconductor die 100 is to be attached. Substrate 120 includes a plurality of second interconnect elements, such as terminal pads, conductive trace ends or other connective surfaces 122, arranged in a pattern on surface 124 thereof corresponding to that of the array of the bond pads 102 of the semiconductor die 100. The terminal pads 122 may each have a surface area similar to that of the bond pads 102, or the surface area may be somewhat larger or smaller than that of bond pads 102. Surface 124 of second semiconductor substrate component 120 may be adhered to dielectric material 110 by the latter's own adhesive characteristics (in the case of a thermoset or thermoplastic resin) or by an adhesive coating thereon in the case of a preformed, adhesive-coated dielectric film. An intermediate semiconductor component assembly 126 results.

Substantially closed interconnect voids 128 are formed between the bond pads 102 and the aligned terminal pads 122 in the regions of cavities 106 in dielectric material 110, the dielectric material providing a spacing, or standoff, between semiconductor die 100 and carrier substrate 120.

Figure 1A:
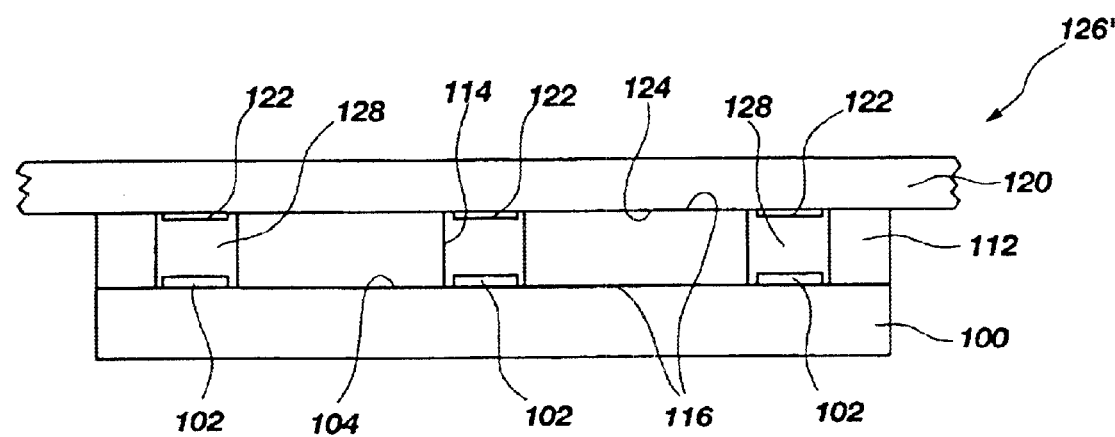
FIG. 1A is a side sectional view of a variant of the exemplary embodiment of FIG. 1.

It will be appreciated, as depicted in FIG. 1A, that a perforated dielectric spacer element 112 may be placed between the semiconductor die 100 and the carrier substrate 120 in lieu of a layer of dielectric material 110 to increase the vertical standoff therebetween and enhance the volume of interconnect voids 128. Spacer 112 depicted in FIG. 1A may includes apertures or vias 114 therethrough corresponding in pattern to the patterns of the bond pads 102 and terminal pads 122. Spacer 112 may be formed from any suitable material, such as a substrate of semiconductor material with passivated exterior surfaces, or a ceramic material. It may be desirable to select a material exhibiting a coefficient of thermal expansion (CTE) similar to those of the semiconductor die 100 and carrier substrate 120, such as intermediate the CTEs of the latter two. The height, and thus volume, of the interconnect voids 128 may thus be determined by the thickness of the dielectric spacer element 112 in combination with the lateral extent of the apertures or vias 114. Dielectric spacer element 112 may be coated with an adhesive layer 116 on each side thereof to facilitate respective attachment to active surface 104 and connective surface 122. A semiconductor component assembly 126' results.

Figure 2:
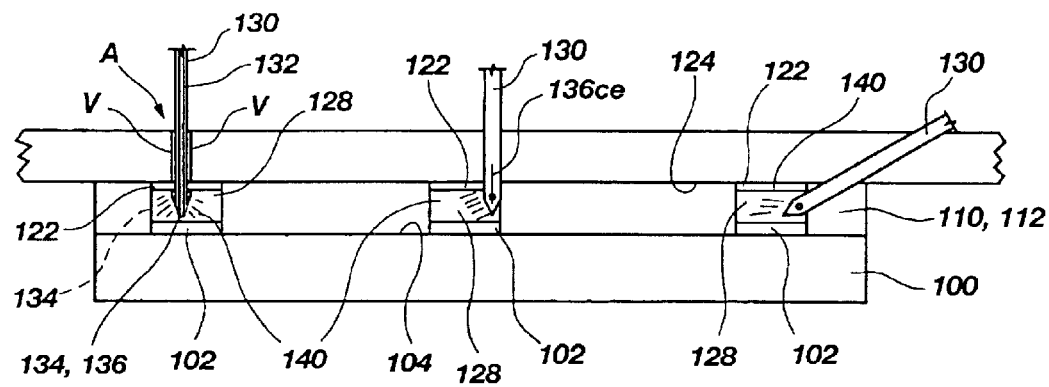
FIG. 2 is a side sectional view of the embodiment of FIG. 1 depicting an injection needle inserted into an interconnect void of the semiconductor component assembly to form a conductive interconnect.
Figure 2A:
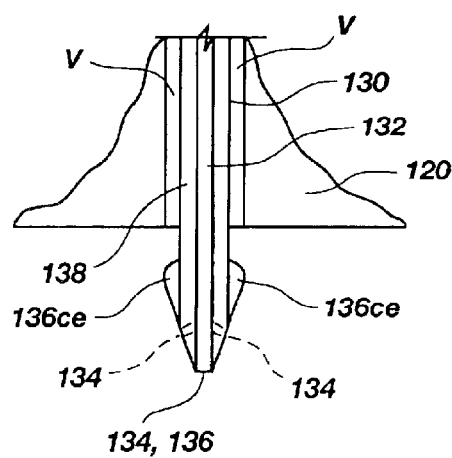
FIG. 2A is an enlarged, side sectional view of the tip of the injection needle employed in FIG. 2.

Turning to FIGS. 2 and 2A, an injection element in the form of injection needle 130 is inserted into each interconnect void 128. Injection needle 130 has a bore 132 terminating in at least one opening 134 through which a conductive material 140 may be injected into the interconnect voids 128. The at least one opening 134 may be located at the tip 136 of the injection needle 130 may be located through needle sidewall 138 opening into bore 132 (shown in broken lines), or may be a combination thereof. Although the injection needle 130 depicted has a straight bore ending in a conical tip, any configuration of a hollow tube that is suitable for insertion into the interconnect voids 128 and having a conductive material 140 passed therethrough may be used. Similarly, injection needle 130 may have any desired cross-sectional shape, whether round, ovoid, polygonal or other. It may be advantageous to have the tip 136 of injection needle 130 formed in a taper and having a sharp end, the reasons for which are set forth in greater detail below. In addition, and also as depicted in FIG. 2A, injection needle 130 may be formed with a sharp tip 136 having at least one (two shown) laterally extending cutting edge 136ce.

In order to insert injection needle 130 into interconnect voids 128, it is necessary to penetrate the body of carrier substrate 120. In order to avoid the necessity of preperforating carrier substrate 120 under and through terminal pads 122, injection needle 130 may be formed with the aforementioned sharp tip and punched through carrier substrate 120 and terminal pads 122 a preselected travel into interconnect voids 128, forming injection aperture A through carrier substrate 120. The at least one cutting edge 136ce, by cutting a slit to the side of the main shaft of injection needle 130 behind tip 136, provides a vent aperture V to one or more sides of injection aperture A communicating between interconnect void 128 and the exterior of carrier substrate 120. Furthermore, while injection needle 130 is depicted in an orientation perpendicular to carrier substrate 120 and punching through a terminal pad 122 as shown at the left-hand side of FIG. 2, it is contemplated that injection needle 130 may be inserted laterally offset to one side and adjacent a terminal pad 122 but within the bounds of an interconnect void 128 as defined by dielectric material 110 or dielectric spacer element 112 as shown in the center of FIG. 2 in broken lines. Likewise, injection needle 130 may be inserted at an acute angle to the plane of carrier substrate 120 to enter an interconnect void 128 without piercing or even contacting a terminal pad 122, as shown at the right-hand side of FIG. 2.

After injection needle 130 is inserted into an interconnect void 128, conductive material 140 is injected, as depicted in FIG. 2. A predetermined volume of the conductive material 140 is injected, such volume being calculated to substantially fill the interconnect void 128 and adhere to bond pad 102 and aligned terminal pad 122 to form a conductive interconnect therebetween. If injection needle is formed with a tip 136 as illustrated, as the conductive material 140 is injected into the interconnect void 128, air contained in the interconnect void 128 and displaced by conductive material 140 exits interconnect void 128 through vent aperture V. Of course, if a sufficiently thin and flexible material is employed for carrier substrate 120, any trapped air may be displaced past the shaft of injection needle 130 without the need for cutting vent aperture V. Upon solidification of conductive material 140, an operable semiconductor component assembly 142 results (see FIG. 3). If conductive material 140 is a molten solder, the characteristic substantially spherical solder ball configuration may result, due to wettability of each aligned bond pad 102 and terminal pad 122 and surface tension of the molten solder.

Conductive material 140 may be any material that is suitably formulated to be placed in a flowable state for injection into the interconnect void 128 and provide an electrical connection between the bond pad 102 and terminal pad 122. For example, conductive material 140 may be a conductive polymer such as, but not limited to, a conductive epoxy, a polymer (again, without limitation, an epoxy) filled with conductive particles, a conductive paste, or a molten solder, such as a silver-, tin- or palladium-based solder. It is desirable that conductive material 140 be formulated to wet and adhere to respective surfaces of bond pad 102 and terminal pad 122. For example, where the conductive material 140 is a molten solder, the bond pad 102 and terminal pad 122 may be fluxed to create a more wettable surface for adherence to the conductive material 140. The fluxing of the bond pad 102 and interconnect target 122 may occur prior to the attachment of the substrate 120 to the semiconductor die 100. Of course, both the bond pad 102 and the terminal pad 122 may be covered with one or more layers of metal as are commonly employed in so-called "under-bump metallization" (UBM) structures on semiconductor dice to facilitate the formation of solder balls thereon, as known to those of ordinary skill in the art.

Once a sufficient amount (which, as noted above, may be a predetermined volume) of conductive material 140 is injected to form a conductive interconnect 144 (see FIG. 3) across the interconnect void 128, injection is halted and the injection needle 130 is withdrawn. In some embodiments, needle withdrawal may be initiated before injection ceases where appropriate to allow any volume of the interconnect void 128 taken by the injection needle 130 to be filled with conductive material 140 as the injection needle 130 is withdrawn. Further, extension of injection needle tip 136 to a location immediately proximate a bond pad 102 followed by controlled retraction of injection needle 130 may ensure better and more complete contact of conductive material with bond pad 102 and terminal pad 122 over larger surface areas thereof.

Any required or desirable equipment or techniques for effecting injection of conductive material 140 into interconnect void 128 may be used. For example, a metering pump may be used for pumping controlled volumes of conductive material 140 to and through the injection needle 130 into each interconnect void 128. Where the conductive material 140 is a molten solder, a heated reservoir under temperature control may be used to melt solder pellets or a flux-containing paste and an injection needle 130 maintained at a controlled, elevated temperature may be employed. Where the conductive material 140 is a conductive or conductor-filled two-part epoxy, separate resin and hardener reservoirs may be employed to feed a mixing chamber via suitable pumps and a metering pump used to feed injection needle 130. Of course, a plurality of injection needles 130 may be employed simultaneously, for example, a plurality of injection needles of the same number as the number of interconnect voids 128 and arranged in the same pattern so that all interconnect voids 128 may be simultaneously filled.

It is also contemplated that the first and second semiconductor substrate components may be assembled together on a wafer scale if semiconductor dice 100 are to be matched, for example, to carrier substrates in the form of interposer substrates. As used herein, the term "wafer" is not limited to conventional wafers of silicon or other semiconductor materials such as gallium arsenide and indium phosphide but also includes bulk substrates including a layer of semiconductor material carried by a supporting structure including, without limitation, silicon on insulator (SOI) substrates as exemplified by silicon on glass (SOG) and silicon on sapphire (SOS) substrates, as well as other structures known to those of ordinary skill in the art. After mutual assembly, injection of conductive material 140 may be effected prior to singulation of the joined semiconductor dice 100 and carrier substrates 120 by the use of ganged injection needles 130 extending perpendicular to an injection head which is controlled to align in a plane parallel to the assembly with the terminal pads 122 of one or more carrier substrates 120 and caused to extend injection needles 130 the aforementioned predetermined travel simultaneously into a plurality of interconnect voids 128, inject conductive material 140, withdraw from the assembly, translate to another desired location over the assembly, and repeat the aforementioned extension, injection and withdrawal. Of course, as noted above, such a ganged needle injection approach may also be used when previously singulated semiconductor dice 100 have been adhered to a surface 124 of any carrier substrate in the course of fabrication, for example, of a multichip module such as a memory module or a motherboard.

Figure 3:
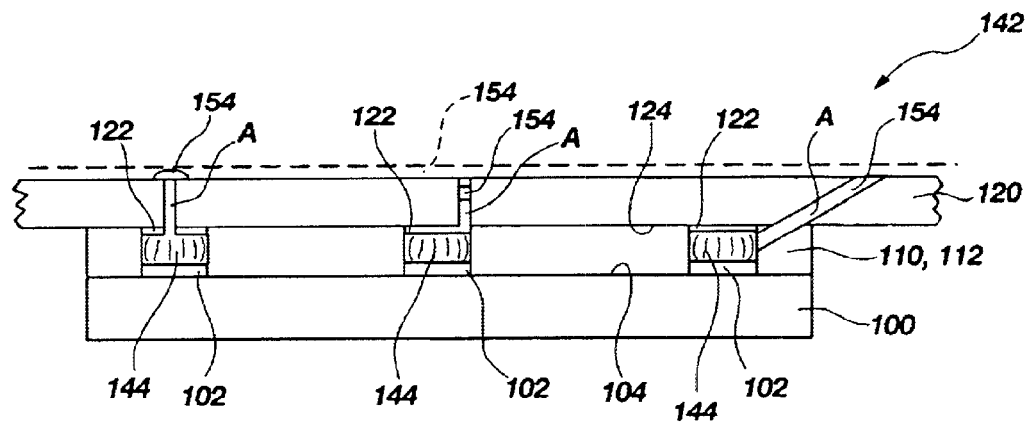
FIG. 3 is a side sectional view of the embodiment of FIG. 1, with a conductive interconnect formed in each of the interconnect voids.

As shown in FIG. 3, conductive interconnect 144 may fill substantially the entire volume of each interconnect void 128. This may be advantageous in that the conductive interconnect 144 thus substantially covers the surface of bond pad 102 as well as the surface of opposing terminal pad 122, providing a superior electrical connection. Of course, it will be appreciated that the conductive interconnect 144 need not fill the entire volume of interconnect void 128, so long as the bond pad 102 and terminal pad 122 are electrically connected therethrough.

According to the present invention, conductive interconnects 144 may be formed without the need for passing a semiconductor die 100 one or more times through a reflow oven, with consequent reduction in thermal stress during fabrication and assembly, maintaining the integrity of the dice and increasing the life of the die and resulting semiconductor component assembly.

Figure 4:
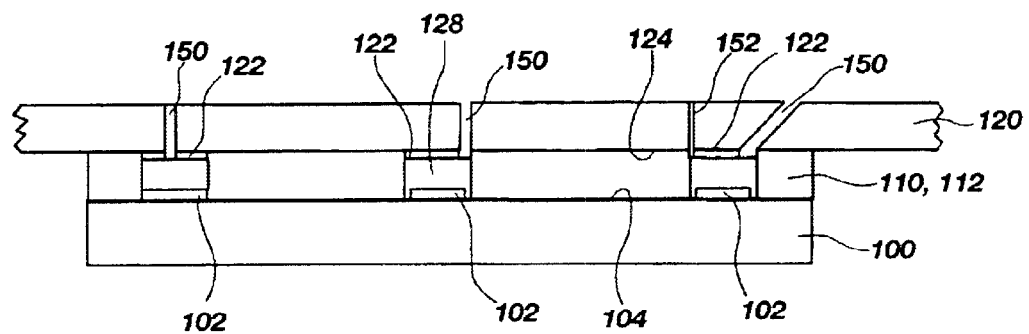
FIG. 4 is a side sectional view of a variation of the embodiment of FIG. 1.

In another embodiment of the present invention, access to each interconnect void 128 may be provided by a preformed injection port 150 which passes through the substrate 120 into the interconnection space. Injection port 150 may be formed to pass through a terminal pad 122 as shown at the left-hand side of FIG. 4, or may enter the interconnect void 128 adjacent terminal pad 122 from a direction perpendicular to the plane of carrier substrate 120 as shown at the center of FIG. 4 or at an acute angle thereto, as shown at the right-hand side of FIG. 4. Injection port 150 may be formed during fabrication of carrier substrate 120 or subsequently formed therein, as by mechanical drilling, etching or laser ablation. In some embodiments, a vent port 152 may be formed in association with each interconnect void 128 for venting of displaced air therefrom during injection of conductive material 140. Although injection port 150 and vent port 152 are depicted as disposed in, and passing through, a carrier substrate 120, it is within the scope of the present invention to provide such access ports through the semiconductor die 100, provided that the ports may be formed therethrough without affecting the circuitry of the semiconductor die 100. It is further contemplated that an injection port 150 may be formed, for example, in a carrier substrate 120 while a vent port associated with the same interconnect void 128 may be formed through semiconductor die 100, or vice versa.

Injection port 150 and vent port 152 (if present) may be formed in the carrier substrate 120 or semiconductor die 100 using any suitable technique known to those of ordinary skill in the art. For example, these ports may be formed by drilling with a mechanical drill bit, by punching, by laser ablation, by wet or dry etching, or as otherwise suitable, given the selected material of the substrate being perforated.

Once conductive interconnect 144 is formed, injection aperture A or injection port 150 and vent port 152 (if present) may be sealed, if necessary, to prevent contamination of the conductive interconnect 144 or interconnect void 128 during subsequent processing or use of the semiconductor component assembly, or shorting of the terminal pads 122 by contact with conductors exterior to the assembly. A dielectric sealing material 154 may be applied over the injection aperture A as shown in FIG. 3, or the injection port 150 and vent ports 152 if present to seal off the interconnect void and, more specifically, any residual conductive material 140 which might remain and extend outwardly beyond terminal pads 122 to or adjacent the exterior of carrier substrate 120. Such residual conductive material may occur due to overfilling of an interconnect void 128 or through withdrawal of injection needle 130. The dielectric sealing material 154 may be any suitable dielectric material, including flowable materials such as epoxies and polymers, thermoplastic films, or adhesive-coated films.

The dielectric sealing material 154 may be applied directly to fill an injection aperture A or injection port 150 and vent port 152 in a volume that occludes the opening to seal it, in a volume that fills the opening to a point beneath (recessed from) the surface of the carrier substrate 120, or in a volume that slightly overfills the opening to create a bump of the sealing material 154 on the surface of the carrier substrate 120. In some embodiments and as shown in broken lines in FIG. 3, the dielectric sealing material 154 may be applied as a layer of flowable material or film that covers either a portion of the exposed surface or the entire exposed surface of the carrier substrate 120. In such embodiments, the injection aperture A or injection port 150 and vent port 152 are filled or at least occluded at the same time such layer is applied to or formed on the carrier substrate 120. On a wafer-scale assembly, the dielectric sealing material 154 may be applied to the center of the assembly and distributed thereover using spin-on techniques.

Figure 5:
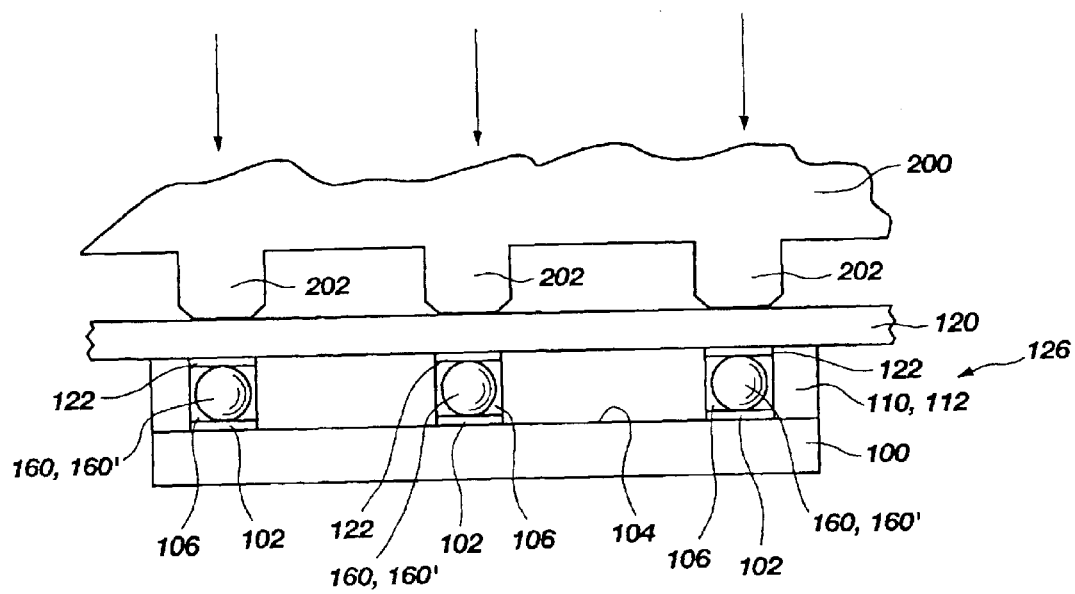
FIG. 5 is a side sectional view of another embodiment of the present invention.

In yet another embodiment of the present invention illustrated in FIG. 5, an intermediate semiconductor component assembly 126 such as is illustrated in FIG. 1 further includes solder balls 160 preplaced in cavities 106 prior to placement of carrier substrate 120 thereover. After assembly of intermediate semiconductor component assembly 126, an ultrasonic head 200 is placed against carrier substrate 120 and activated to vibrate and generate heat sufficient to at least partially melt solder balls 160 to bond to bond pads 102 and terminal pads 122. It is also contemplated that pellets of a conductive or conductor-filled thermoplastic resin 160 may be preplaced in cavities 106, and ultrasonic head 200 employed to melt the resin to effect a connection between bond pads 102 and terminal pads 122. It is also contemplated that a conductive paste, such as a solder paste, may be used. As shown in FIG. 5, ultrasonic head 200 may include protrusions 202 therefrom arranged in the same pattern as bond pads 102 and terminal pads 122 so that contact may be made at those locations to better focus the ultrasonic energy, shorten heating time and avoid unnecessary heating of other portions of the assembly.

It will be recognized and appreciated by those of ordinary skill in the art that details of the methods herein described may be varied considerably without departing from the scope of the invention as defined by the claims which follow herein, and that additions, deletions and modifications to the exemplary embodiments of the invention as described may be made without departing from the scope thereof.

What is claimed is:

1. A method for electrically connecting semiconductor component substrates, comprising:
providing a first semiconductor component substrate having at least one interconnect element on a surface thereof;
disposing a dielectric element having at least one cavity therein on the surface of the first semiconductor component substrate, with the at least one cavity located over the at least one interconnect element;
providing a second semiconductor component substrate having at least another interconnect element on a surface thereof;
securing the second semiconductor component substrate to the first semiconductor component substrate with the dielectric element interposed therebetween and the at least another interconnect element of the second semiconductor component substrate aligned with the at least one cavity to form at least one interconnect void; and
injecting a flowable conductive material into the at least one interconnect void through one of the first and second semiconductor component substrates to form at least one conductive interconnect structure between the at least one and the at least another interconnect elements.

2. The method according to claim 1, wherein providing a first semiconductor component substrate having at least one interconnect element on a surface thereof comprises providing a semiconductor die having at least one bond pad on a surface thereof.

3. The method according to claim 1, wherein providing a second semiconductor component substrate having at least another interconnect element on a surface thereof comprises providing a carrier substrate having at least one terminal pad on a surface thereof.

4. The method according to claim 1, wherein disposing a dielectric element on the surface of the first semiconductor component substrate comprises disposing one of a flowable dielectric material and a preformed dielectric element on the surface of the first semiconductor component substrate.

5. The method according to claim 1, further comprising selecting the flowable conductive material to comprise one of a conductive polymer, a conductor-filled polymer, a conductive paste, and a molten solder.

6. The method according to claim 1, wherein injecting a flowable conductive material into the at least one interconnect void through one of the first and second semiconductor component substrates comprises inserting an injection needle through one of the first and second semiconductor component substrates and into the at least one interconnect void.

7. The method according to claim 6, wherein inserting an injection needle through one of the first and second semiconductor component substrates comprises perforating the one of the first and second semiconductor component substrates with the injection needle.

8. The method according to claim 7, further including forming at least one vent aperture to one side of the injection needle concurrently with the perforation of the one of the first and second semiconductor component substrates.

9. The method according to claim 7, wherein perforating the one of the first and second semiconductor component substrates comprises contacting an interconnect element associated with the at least one interconnect void with the injection needle.

10. The method according to claim 9, wherein contacting the interconnect element associated with the at least one interconnect void comprises perforating the interconnect element with the injection needle.

11. The method according to claim 7, further comprising contacting the dielectric element with the injection needle.

12. The method according to claim 11, wherein contacting the dielectric element with the injection needle comprises perforating the dielectric element with the injection needle.

13. The method according to claim 6, further comprising orienting the injection needle substantially perpendicular to a plane of the one of the first and second semiconductor component substrates through which the injection needle is inserted.

14. The method according to claim 6, further comprising orienting the injection needle in a nonperpendicular relationship to a plane of the one of the first and second semiconductor component substrates through which the injection needle is inserted.

15. The method according to claim 6, further comprising disposing a tip of the injection needle adjacent to a side of the at least one interconnect void.

16. The method according to claim 6, further comprising withdrawing the injection needle from the at least one interconnect void during the injecting of the flowable conductive material thereinto.

17. The method according to claim 7, further including sealing an open perforation formed by insertion of the injection needle after withdrawal thereof with a dielectric sealing material.

18. The method according to claim 17, wherein sealing comprises occluding the open perforation.

19. The method according to claim 18, wherein occluding the open perforation comprises disposing a layer of the dielectric sealing material over an exposed surface of the one of the first and second semiconductor component substrates.

20. The method according to claim 6, wherein inserting an injection needle through one of the first and second semiconductor component substrates comprises inserting the injection needle through an injection port extending to the at least one interconnect void.

21. The method according to claim 20, further comprising forming the injection port through the one of the first and second semiconductor component substrates.

22. The method according to claim 21, further comprising forming the injection port through an interconnect element.

23. The method according to claim 21, further comprising forming the injection port adjacent an interconnect element.

24. The method according to claim 21, further including forming a vent port through one of the first and second semiconductor component substrates and extending to the at least one interconnect void.

25. The method according to claim 24, further including sealing the vent port with a dielectric sealing material after withdrawal of the injection needle.

26. The method according to claim 25, wherein sealing comprises occluding the vent port.

27. The method according to claim 26, wherein occluding the vent port comprises disposing a layer of the dielectric sealing material over an exposed surface of the one of the first and second semiconductor component substrates.

28. The method according to claim 20, further including sealing the injection port with a dielectric sealing material after withdrawal of the injection needle.

29. The method according to claim 28, wherein sealing comprises occluding the injection port.

30. The method according to claim 29, wherein occluding the injection port comprises disposing a layer of the dielectric sealing material over an exposed surface of the one of the first and second semiconductor component substrates.

31. The method according to claim 1, wherein injecting a flowable conductive material into the at least one interconnect void comprises injecting a molten solder into the at least one interconnect void.

32. The method according to claim 31, wherein the flowable conductive material comprises a molten solder and further comprising fluxing the interconnect elements prior to injecting the molten solder.

33. The method according to claim 1, wherein injecting a flowable conductive material into the at least one interconnect void to form at least one conductive interconnect structure comprises substantially filling a volume of the at least one interconnect void with the flowable conductive material.

34. The method according to claim 1, further comprising selecting one of the first and second semiconductor component substrates to comprise a semiconductor die and selecting another of the first and second semiconductor component substrates to comprise a carrier substrate.

35. The method according to claim 1, further comprising selecting a thickness for the dielectric element to at least in part determine a volume of the at least one interconnect void.

36. The method according to claim 1, wherein the at least one interconnect element comprises a plurality of interconnect elements, the at least another interconnect element comprises a like plurality of another interconnect elements, and the at least one interconnect void comprises a like plurality of interconnect voids therebetween.

37. The method according to claim 36, further comprising simultaneously inserting a plurality of injection needles into a like plurality of interconnect voids.

38. The method according to claim 37, further comprising simultaneously injecting the flowable conductive material into the like plurality of interconnect voids.

* * * * *

UNITED STATES PATENT AND TRADEMARK OFFICE
CERTIFICATE OF CORRECTION

PATENT NO. : 6,982,191 B2
APPLICATION NO. : 10/667003
DATED : January 3, 2006
INVENTOR(S) : Charles E. Larson It is certified that error appears in the above-identified patent and that said Letters Patent is hereby corrected as shown below:

COLUMN 3, LINE 65, change "material 10" to --material 110--
COLUMN 8, LINE 59, change "resin 160" to --resin 160'--

Signed and Sealed this

Thirtieth Day of October, 2007

JON W. DUDAS
*Director of the United States Patent and Trademark Office*